(12) United States Patent
Seff et al.

(10) Patent No.: US 6,565,394 B2
(45) Date of Patent: May 20, 2003

(54) CLAMPING MECHANISM FOR A JUMPER CABLE ASSEMBLY FOR USE WITH A HORN BYPASS WITHIN AN ELECTRICAL METER CENTER

(75) Inventors: Paul D. Seff, Lincoln, IL (US); James M. Campbell, Atlanta, IL (US)

(73) Assignee: Eaton Corporation, Cleveland, OH (US)

( * ) Notice: Subject to any disclaimer, the term of this patent is extended or adjusted under 35 U.S.C. 154(b) by 61 days.

(21) Appl. No.: 09/871,254

(22) Filed: May 31, 2001

(65) Prior Publication Data

US 2002/0182930 A1 Dec. 5, 2002

(51) Int. Cl.[7] ................................................. H01R 4/50
(52) U.S. Cl. ........................................ 439/807; 24/569
(58) Field of Search ................................ 439/502, 504, 439/508, 431, 432, 803, 807, 727; 24/525, 536, 456, 569

(56) References Cited

U.S. PATENT DOCUMENTS

| | | | | |
|---|---|---|---|---|
| 1,282,630 A | * | 10/1918 | Rhodus | |
| 1,559,349 A | * | 10/1925 | Mott | |
| 1,667,702 A | * | 4/1928 | Powell | |
| 1,809,774 A | * | 6/1931 | Coates | |
| 1,968,432 A | * | 7/1934 | Wilson | 439/388 |
| 2,119,294 A | * | 5/1938 | Schaefer | 439/522 |
| 2,159,154 A | * | 5/1939 | Hixon | |
| D140,861 S | * | 4/1945 | Conlan | |
| 2,516,713 A | * | 7/1950 | McClure | 24/569 |
| 2,867,787 A | * | 1/1959 | Nilsson | |
| 4,025,414 A | * | 5/1977 | Vendramini | |
| 4,784,621 A | * | 11/1988 | Auclair | 439/811 |
| 5,684,408 A | * | 11/1997 | King | 324/718 |
| 5,795,195 A | * | 8/1998 | Karlsberger | 439/807 |

OTHER PUBLICATIONS

Ekstrom Industries, INC., *Horn Type Bypass Jumper Cable*, Part No.1000–SP2917, Bulletin HBJC 795–500, 9197 Ekstrom Industries, U.S.A.

Photograph of a clamp at the end of the Ekstrom Industries jumper cable at Cite No. A above.

* cited by examiner

*Primary Examiner*—Neil Abrams
(74) *Attorney, Agent, or Firm*—Martin J. Moran

(57) ABSTRACT

A jumper cable for use with electrical meter sockets includes an improved clamp at each end. The clamp includes a substantially coaxial threaded rod, threadedly secured to a movable jaw that may move between an open position and a closed position, guided between a pair of guide surfaces that are angled in an orientation that is not parallel to the threaded rod. The movable jaw may therefore be caused to be move laterally by rotating a knob at the end of the threaded rod that is located at the end of the clamp opposite the jaws, where it will provide the best access to itself, and minimize interference with meter removal.

12 Claims, 5 Drawing Sheets

CLAMPING MECHANISM FOR A JUMPER CABLE ASSEMBLY FOR USE WITH A HORN BYPASS WITHIN AN ELECTRICAL METER CENTER

BACKGROUND OF THE INVENTION

1. Field of the Invention

The present invention relates to meter centers for electrical power distribution systems. Specifically, it relates to improvements in jumpers to assist in the removal of individual meters from the meter center without interrupting current flow.

2. Description of the Related Art

A typical meter center for metering electrical power delivered to multiple locations from a common system includes a plurality of meter compartments, with each meter compartment containing one meter corresponding to one location to which power is delivered. A supply bus, typically a three-phase bus having three line wires plus a neutral, extend from the feeder bus to the meter compartment. The feeder buses in turn extend from the utility power lines. Tenant buses connect to the meter compartment to the location wherein the electrical power is utilized. Both the supply buses and tenant buses are connected to a meter socket of the meter compartment, with the meter socket securing a meter providing an electrical connection between the supply buses and the tenant buses. This electrical connection is formed by single ended plug-in jaws on the meter socket, dimensioned and configured to engage corresponding stabs on the meter.

When a meter must be disconnected from the meter socket, it is desirable to provide continued electrical power to the location monitored by the meter. A typical meter socket provides a horn bypass adjacent to, and an electrical communication with, each plug-in jaw and its associated bus. The horn bypasses permit connection of a jumper from the horn bypass of the supply bus to the horn bypass of the tenant bus prior to removal of the meter from the meter socket. Some presently available jumper cables include a clamp at each end, with each clamp having a pair of jaws surrounded by insulation. Mating angled surfaces on the jaws and insulation cause the jaws to be drawn together when the insulation is rotated. However, presently available jumpers do not provide adequate clamping to the bypass horns, and also interfere with insertion and removal of the meter.

Accordingly, an improved jumper for connecting the supply bus with its corresponding tenant bus prior to removal of an electrical meter from its meter socket is desired.

SUMMARY OF THE INVENTION

The present invention is directed to an improved clamp for jumper cables for use with electrical meters. The clamp includes an electrically conductive stationary jaw, and an electrically conductive movable jaw. The opposing stationary and movable jaws are housed within an insulator sleeve. The stationary jaw and insulator sleeve define a channel therethrough, dimensioned and configured to receive a threaded rod. The threaded rod is threadedly engaged to the movable jaw at one end, and includes a knob at its opposite end. The stationary jaw and movable jaw define corresponding angled surfaces, so that turning the threaded rod to extend or retract the movable jaw will move the movable jaw parallel to these angled surfaces, thereby causing the jaw to move between an open position and a closed position. The channel containing the threaded rod is sufficiently large relative to the threaded rod to permit lateral movement of the rod, corresponding to the inward and outward movement of the movable jaw.

A jumper cable includes a clamp of the present invention at either end, permitting the jumper cable to be connected between a supply bus and its corresponding tenant bus within the socket for an electrical meter, by securing each clamp to the bypass horn corresponding to each bus. A typical socket for an electrical meter includes two supply buses, and two tenant buses, although the present invention is not limited to this number of corresponding supply and tenant buses. While the meter is in use, the meter forms and electrical connection between each supply bus and its corresponding tenant bus, thereby completing the current path from the utility lines, through the feeder bus, the supply bus, the meter, and the tenant bus, and finally to the consumer. This electrical connection is formed by single-ended plug-in jaws on the meter socket, with each plug-in jaw corresponding to one bus, and a stab on the meter corresponding to each jaw.

To remove an individual meter from its socket, one end of a jumper cable is first clamped to the bypass horn corresponding to one of the buses (which may be either a supply bus or a tenant bus), and the knob is turned to move the movable jaw from its open position to its closed position, thereby securing the bypass horn between the movable jaw and the fixed jaw. The opposite end of the jumper cable is likewise clamped to the corresponding bus. The procedure is repeated until a jumper cable connects each supply bus within the socket to its corresponding tenant bus. The meter may then be removed from the socket, with the stabs in the meter exiting the jaws. The electrical current which previously flowed from the supply buses, through the meter, to the tenant buses will now flow from the supply buses, through the jumper cables, to the tenant buses, until servicing of the meter is complete, and the meter is reattached to the socket. At this point, the jumper cables are removed from the socket.

A clamp of the present invention is particularly advantageous for making electrical connections because the inner clamping surfaces of the stationary and moveable jaws remain parallel to each other as the moveable jaw is moved. This maximizes the surface area contact between each jaw of the clamp and the bypass horn, maximizing the security of the clamp and minimizing electrical resistance in the connection between the clamp and bypass horn.

It is therefore an aspect of the present invention to provide a jumper cable for use with electrical meter sockets, having a clamp at each end providing secure clamping to the bypass horns within the meter socket.

It is another aspect of the present invention to provide a jumper cable for use with electrical meter sockets, wherein the clamps at each end of the jumper cable do not interfere with installation and removal of the electrical meter from the socket.

It is a further aspect of the present invention to provide a jumper cable for use with electrical meter sockets, wherein electrical resistance within the connection between the clamping jaws and bypass horn is minimized.

It is another object of the present invention to provide a jumper cable for use with electrical meter sockets, wherein the jaws of the cable's clamps remain parallel throughout movement between their open and closed positions.

These and other aspects of the invention will become apparent through the following description and drawings.

BRIEF DESCRIPTION OF THE DRAWINGS

Like reference numbers denote like elements throughout the drawings.

DETAILED DESCRIPTION

The present invention is directed to an improved clamp for a jumper for use with electrical meter sockets.

Figure 1:
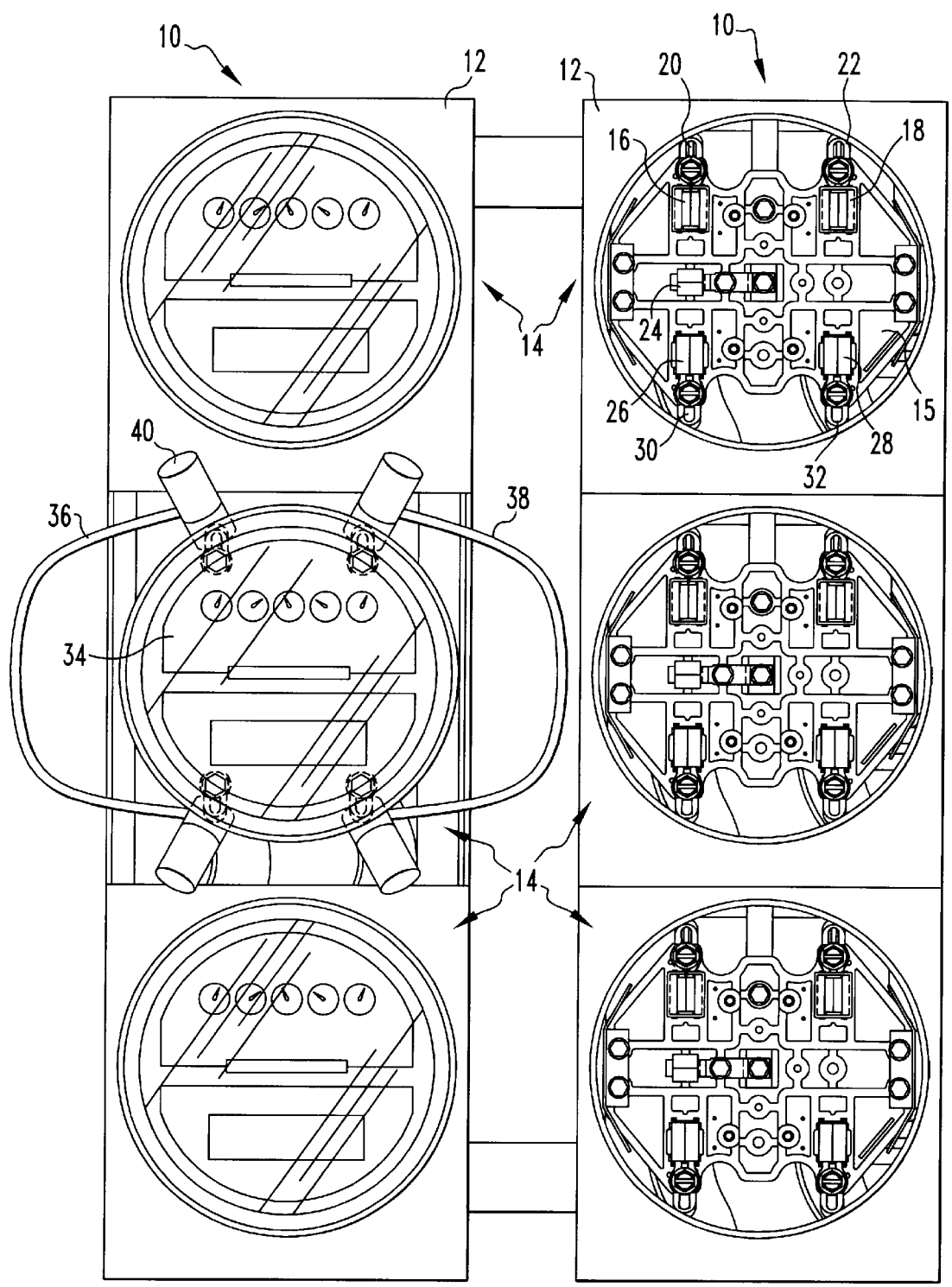
FIG. 1 is a front view of meter center for which a jumper of the present invention will be utilized, illustrating two jumpers of the present invention connected to the bypass horns of a meter.
Figure 2:
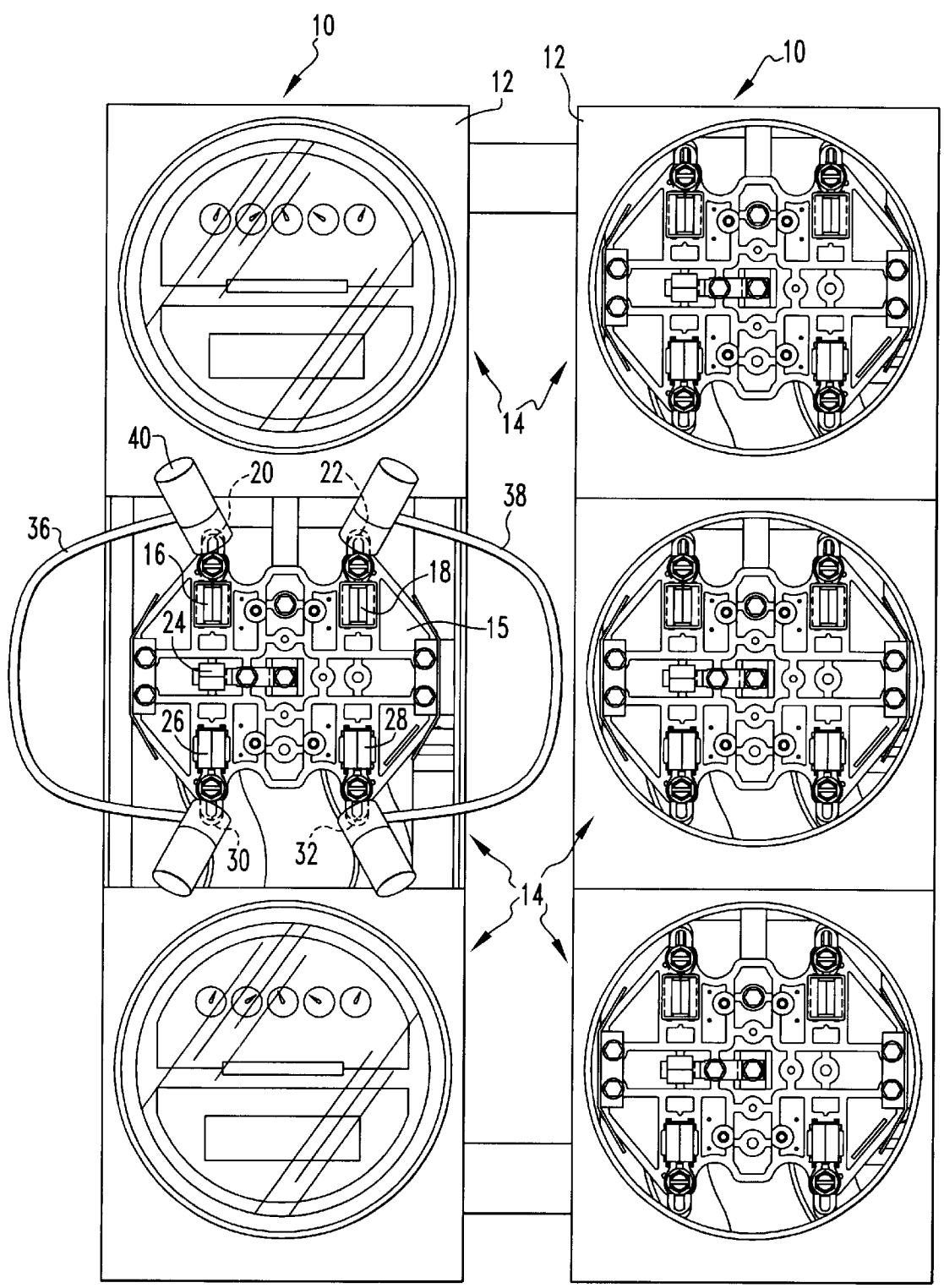
FIG. 2 is a front view of a meter center, showing two jumpers of the present invention connected to the bypass horns of the supply buses and tenant buses of a meter socket, with the meter removed.
Figure 3:
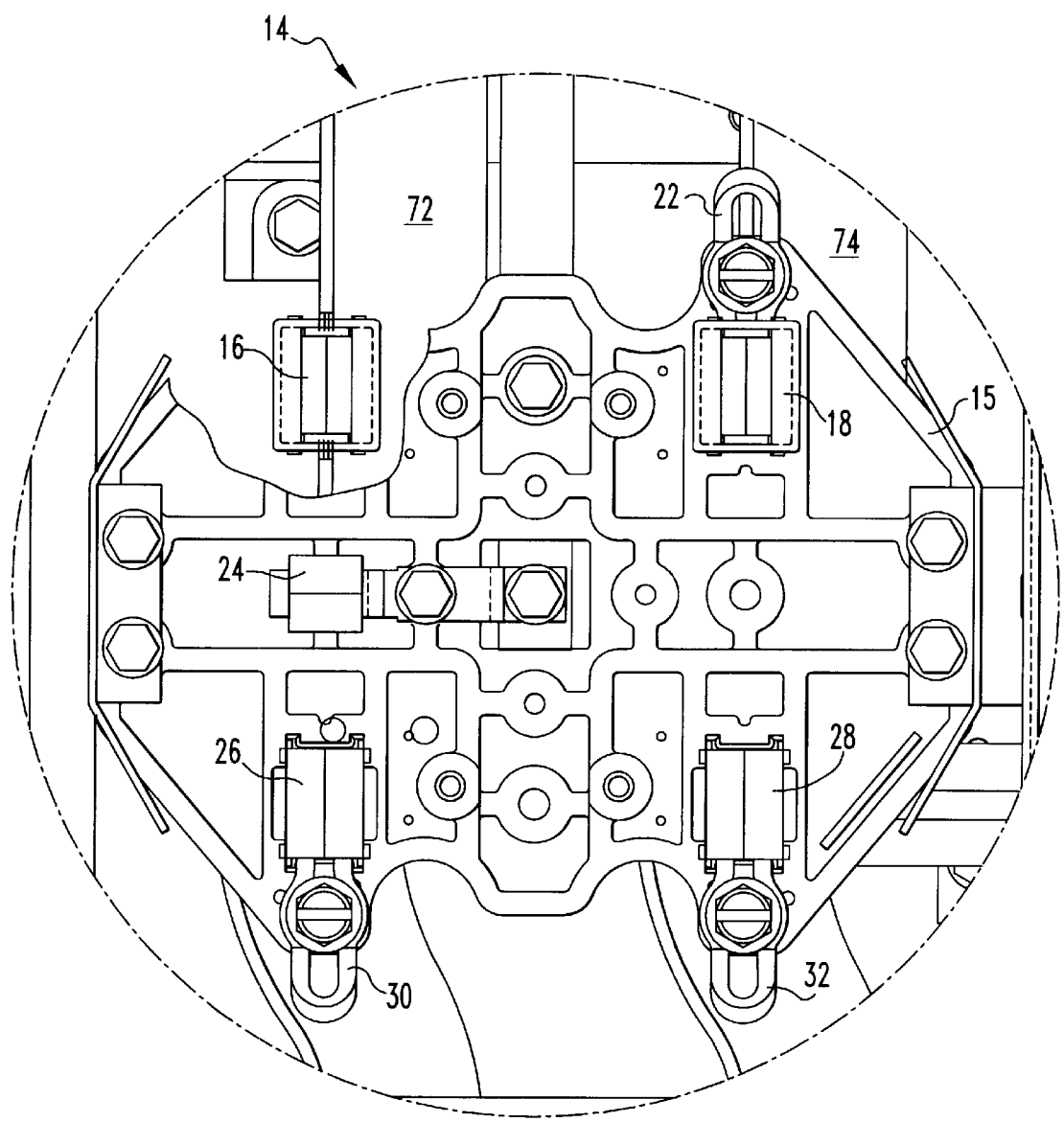
FIG. 3 is a front view of a typical meter socket for which the present invention will be used.

A typical electrical meter center 10 is illustrated in FIGS. 1–2. The meter center 10 includes a housing 12, having a plurality of meter socket assemblies 14. Each meter socket assembly 14 includes a socket plate 15, to which the various components of the socket 14 are secured. Electrical power will be supplied to the meter center by feeder buses (not shown, but well known), with a typical number of feeder buses being four. Three of the feeder buses will supply alternating current, with their phases being 120° apart, and the fourth feed bus will be a neutral bus. Each meter center will have a pair of supply buses 72, 74, each supply bus 72, 74 being electrically connected to one of the feeder buses through phase balancers. Each supply bus will include means for forming an electrical connection to the supply bus within the meter socket 14, typically including plug-in jaws 16, 18 and bypass horns 20, 22. Likewise, the neutral feeder bus is electrically connected to the neutral plug-in jaws 24 within the meter socket 14. A pair of tenant buses (not shown, but well known) leads from each meter socket assembly 14 to a location wherein electrical power will be consumed, for example, a residence or business. Each of the tenant buses is electrically connected to plug-in jaws 26, 28 within the meter socket assembly, and also to bypass horns 30, 32 within the meter socket assembly 14. The electrical meter 34 includes a stab corresponding to each of the plug-in jaws 16, 18, 24, 26, and 28 (not shown, and well known in the art). When the meter 34 is installed within the meter socket assembly 14, the meter provides an electrical connection between the plug-in jaws for the supply buses 16, 18 and the plug-in jaws for the tenant buses 26, 28, thereby permitting the flow of electricity from the supply buses, through the meter, to the tenant buses, and finally to the location of the consumer.

The use of the plug-in jaws 16, 18, 24, 26, and 28 within the meter socket 14, and corresponding stabs on the back of the meter 34, permits the meter 34 to be removed from the socket 14 when servicing the meter 34 is desired. When servicing the meter 34, it is desirable to provide uninterrupted flow of electricity to the consumer. This is accomplished by connecting a jumper 36 between the supply bus bypass horn 20 and tenant bus bypass horn 30, and passing a second jumper 38 from the supply bus bypass horn 22 to the tenant bus bypass horn 32. Current will then pass through the jumpers, permitting the meter 34 to be removed without interruption of electrical power.

Figure 4:
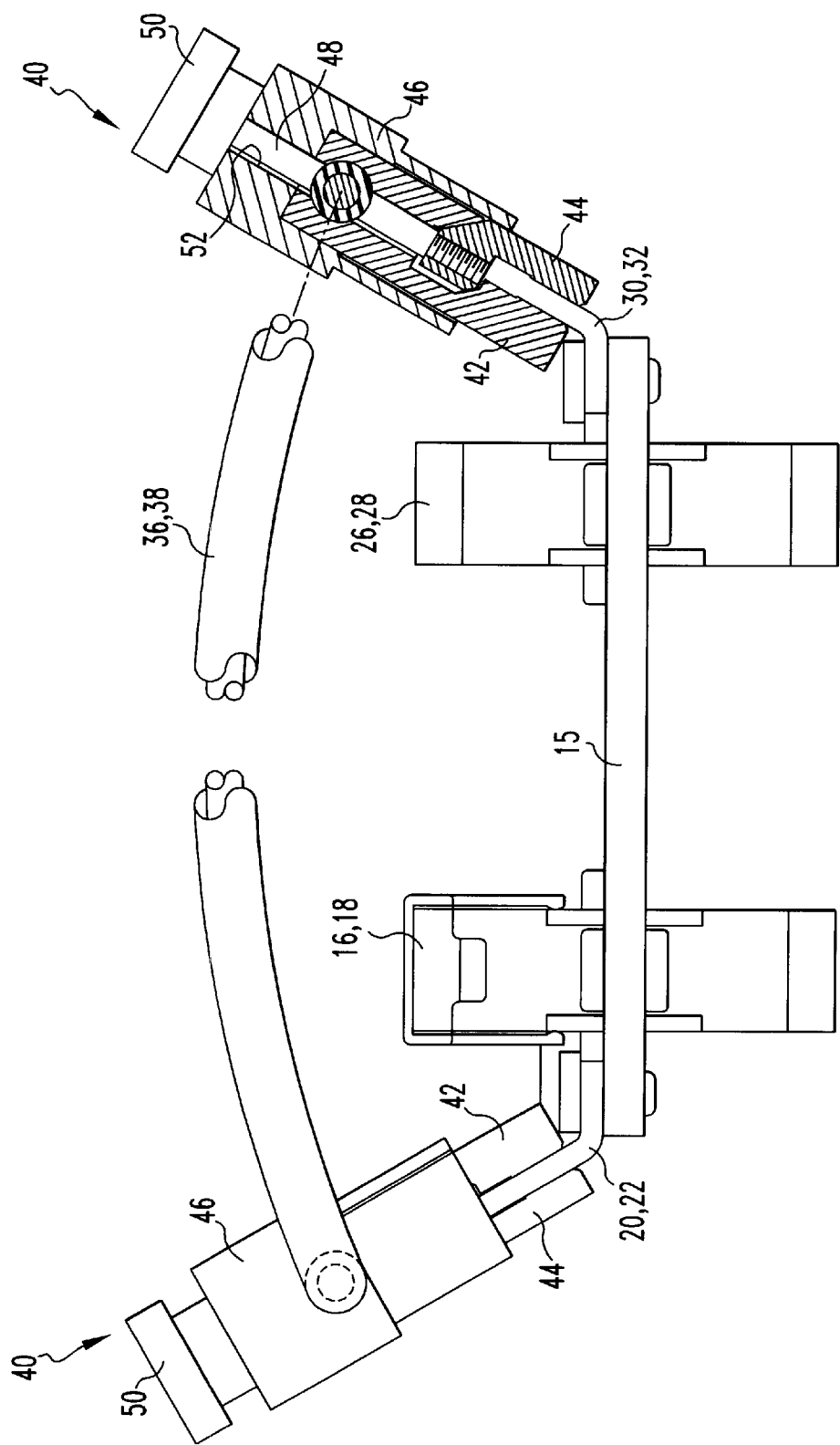
FIG. 4 is a side view of a meter socket plate with the meter disconnected, and a jumper of the present invention connected to the bypass horns.
Figure 5:
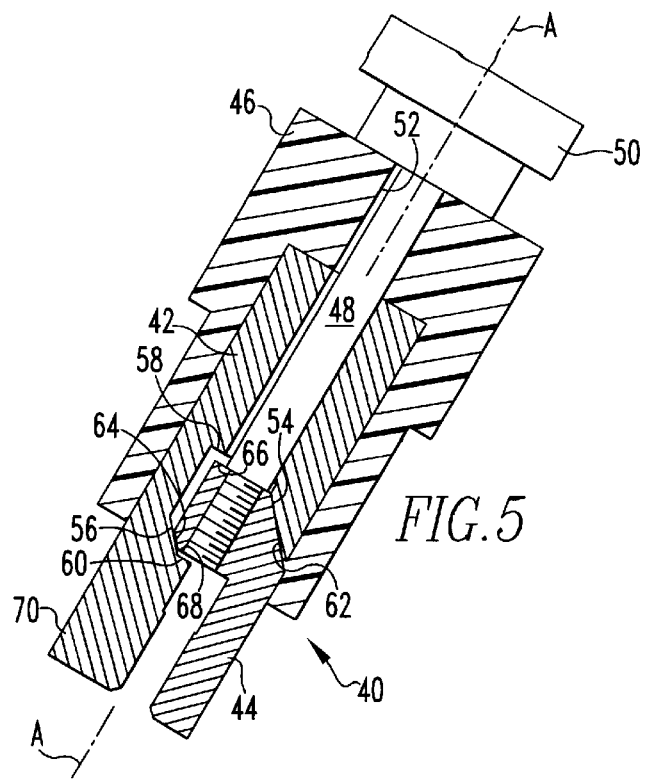
FIG. 5 is a side cross-sectional view of a clamp for each end of a jumper according to the present invention, illustrating the clamp in its open position.
Figure 6:
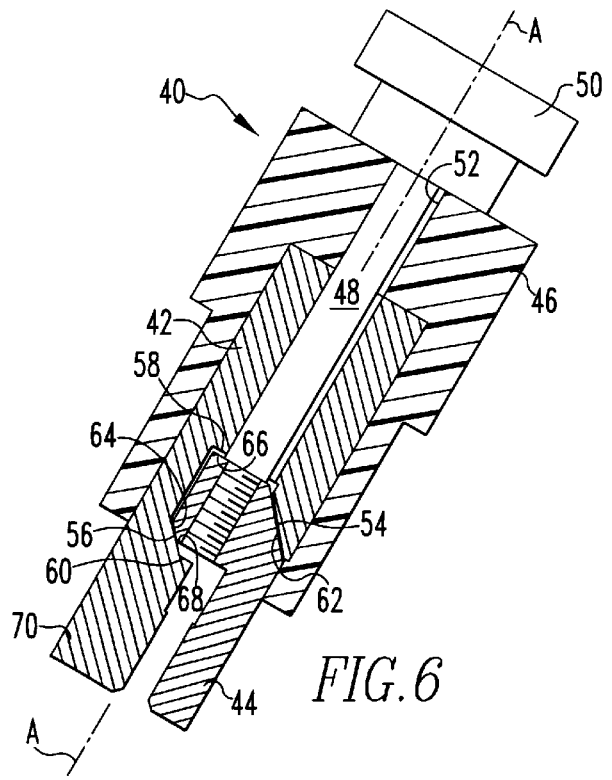
FIG. 6 is a side cross-sectional view of a clamp for each end of a jumper according to the present invention, illustrating the clamp in its closed position.

Referring to FIGS. 4–6, each of the jumpers 36, 38 includes a clamp 40 at each end. Each clamp 40 includes an electrical conductive stationary jaw 42 and an electrically conductive movable jaw 44. An example of a suitable electrically conductive material for the stationary jaw 42 and movable jaw 44 is bronze. The jaws 42, 44 are surrounded by insulation 46, with an example of a suitable insulating material being plastic. A threaded rod 48 having a knob 50 at one end passes through a channel 52 defined within the insulation 46 and stationary jaw 42.

The threaded rod 48 threadedly engages the movable jaw 44, so that rotation of the threaded rod 48 causes movement of the movable jaw 44 parallel to the axis A of the clamp 40. The stationary jaw 42 defines a pair of substantially parallel angled guide surfaces 54, 56 and a pair of limiting surfaces 58, 60 on opposing sides of the movable jaw 44. The movable jaw 44 likewise includes a pair of substantially parallel angled bearing surfaces 60, 62, corresponding to the angled surfaces 54, 56 of the stationary jaw 42. The movable jaw 44 also includes limit surfaces 66, 68 corresponding to the limiting surfaces 58, 60 of the stationary jaw 42. The angled guide and bearing surfaces 54, 56, 62, 64 are dimensioned and configured to cause the movable jaw 44 to move towards or away from the grasping portion 70 of the stationary jaw 42 when the threaded rod 48 is turned. In the illustrated example, turning the threaded rod 48 to move the movable jaw 44 away from the knob 50 will cause the movable jaw to move parallel to the angled guide surfaces 54, 56 until the limit surface 68 of the movable jaw 44 strikes the limiting surface 60 of the stationary jaw 42, corresponding to the open position of the clamp 40. Likewise, rotating the threaded rod 48 to move the movable jaw 44 towards the knob 50 will again cause the movable jaw 44 to move parallel to the angled guide surfaces 54, 56 until the limit surface 66 of the movable jaw 44 strikes the limiting surface 58 of the stationary jaw 42, defining the closed position of the clamp 40. The channel 52 is sufficiently wide so that the threaded rod 48 may move perpendicular to the clamp's axis A, corresponding to the movement of the movable jaw 44.

Although the present example illustrates outward movements of the movable jaw 44 corresponding to opening the clamp 40, those skilled in the art will appreciate from reading this description that rotating the angled surfaces 54, 56, 62, 64 approximately 90° will result in another embodiment of the clamp of the present invention wherein outward movement of the moveable jaw 44 corresponds to closing the clamp 40.

When it is desired to service an electrical meter 34, a pair of jumpers 36, 38, with each jumper 36, 38 having a clamp 40 at each end are utilized to provide a constant flow of current to the consumer. The first jumper 36 may be connected between the supply bypass horn 20 and tenant bypass horn 30. This connection is accomplished by first rotating the knob 50 of one clamp 40 to move the jaw 44 towards it open position, placing the bypass horn 20 between the grasping portion 70 of the stationary jaw 42 and the movable jaw 44, and then rotating the knob 50 to move the movable jaw 44 from its open position to its closed position, thereby grasping the bypass horn 20 between the stationary jaw 42 and movable jaw 44. Likewise, the second clamp 40 at the opposite end of the jumper 36 is opened by turning the knob 50 to move the movable jaw 44 towards its open position, and then positioned so that the movable jaw 44 and grasping portion 70 of the stationary jaw 42 are on opposing sides of the tenant bypass horn 30. The knob 50 is then turned to move the movable jaw 40 towards the stationary jaw 42, thereby securing the jaws 42, 44 around the bypass horn 30. The second, identical jumper 38 is connected between the supply bypass horn 22 and tenant bypass horn 32 in like manner. The clamps 40 may, of course, be connected to the bypass horns 20, 22, 30, 32 in any order. The meter 34 may then be removed from the socket 14 without interrupting the flow of current between the supply buses and tenant buses. When servicing the meter 34 is complete, the meter 34 is reinstalled within the socket 14, and the jumpers 36, 38 are removed.

A clamp 40 of the present invention is particularly advantageous for making electrical connections because the inner clamping surfaces of the stationary and moveable jaws 42,44 remain parallel to each other as the moveable jaw 44 is moved. This maximizes the surface area contact between each jaw of the clamp and the bypass horn, maximizing the security of the clamp and minimizing electrical resistance in the connection between the clamp and bypass horn.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A clamp for a jumper cable for use with electrical meter sockets, said clamp comprising:
    a stationary jaw having a grasping portion, defining a channel therethrough, said channel being substantially parallel to a longitudinal axis of said clamp;
    a moveable jaw structured to move between a closed position and an open position and to remain substantially parallel to said stationary jaw in said closed and open positions, and therebetween;
    a threaded rod passing through said channel, said threaded rod having a pair of ends, one of said ends being threadedly secured to said moveable jaw; and
    means for moving said movable jaw between said closed position and said open position responsive to rotation of the threaded rod, said means keeping said stationary jaw's grasping portion and said moveable jaw substantially parallel, said means comprising:
        a pair of substantially parallel guide surfaces defined within said stationary jaw, said guide surfaces being oriented in an angle between, and not including, parallel to and perpendicular to said threaded rod;
        a pair of substantially parallel bearing surfaces defined on said moveable jaw, said bearing surfaces engaging said guide surfaces; and
        said guide surfaces and said bearing surfaces being dimensioned and configured to guide said movable jaw between said open position and said closed position responsive to rotation of said threaded rod in a direction nonparallel to said threaded rod.

2. The clamp according to claim 1, wherein said pair of substantially parallel angled guide surfaces are defined within said stationary jaw.

3. The clamp according to claim 1, further comprising an insulating sleeve surrounding said stationary jaw and said moveable jaw.

4. The clamp according to claim 3, wherein said axial channel is defined within said stationary jaw and said insulating sleeve.

5. The clamp according to claim 1, wherein one of said ends of said threaded rod includes a knob, said knob being dimensioned and configured to facilitate turning said threaded rod.

6. The clamp according to claim 1, further comprising:
    a pair of limiting surfaces defined on said stationary jaw, said pair of limiting surfaces defining said open position and said closed position of said movable jaw; and
    a pair of limit surfaces defined on said movable jaw, one of said pair of limit surfaces engaging one of said pair of limiting surfaces when said movable jaw is in said closed position, and the other of said pair of limit surfaces engaging the other of said pair of limiting surfaces when said movable jaw is in said open position.

7. A jumper for use with electrical meters, said jumper comprising:
    an electrically conductive cable having a pair of ends, each end having a clamp, each of said clamps comprising:
        a stationary jaw having a grasping portion, defining a channel therethrough, the channel being substantially parallel to a longitudinal axis of said clamp;
        a moveable jaw structured to move between a closed position and an open position, and to remain substantially parallel to said stationary jaw in said closed and open positions, and therebetween;
        a threaded rod passing through said channel, said threaded rod having a pair of ends, one of said ends being threadedly secured to said moveable jaw; and
        means for moving said movable jaw between said closed position and said open position responsive to rotation of the threaded rod, said means keeping said stationary jaw's grasping portion and said moveable jaw substantially parallel, said means comprising:
            a pair of substantially parallel guide surfaces defined within said stationary jaw, said guide surfaces being oriented in an angle between, and not including, parallel to and perpendicular to said threaded rod;
            a pair of substantially parallel bearing surfaces defined on said moveable jaw, said bearing surfaces engaging said guide surfaces; and
            said guide surfaces and said bearing surfaces being dimensioned and configured to guide said movable jaw between said open position and said closed position responsive to rotation of said threaded rod in a direction nonparallel with said threaded rod.

8. The jumper according to claim 7, wherein said pair of substantially parallel angled guide surfaces are defined within said stationary jaw.

9. The jumper according to claim 7, further comprising an insulating sleeve surrounding said stationary jaw and said moveable jaw.

10. The jumper according to claim 9, wherein said axial channel is defined within said stationary jaw and said insulating sleeve.

11. The jumper according to claim 7, wherein one of said ends of said threaded rod includes a knob, said knob being dimensioned and configured to facilitate turning said threaded rod.

12. The jumper according to claim 7, further comprising:

a pair of limiting surfaces defined on said stationary jaw, said pair of limiting surfaces defining said open position and said closed position of said movable jaw; and a pair of limit surfaces defined on said movable jaw, one of said pair of limit surfaces engaging one of said pair of limiting surfaces when said movable jaw is in said closed position, and the other of said pair of limit surfaces engaging the other of said pair of limiting surfaces when said movable jaw is in said open position.

* * * * *